(12) United States Patent
Borthakur

(10) Patent No.: US 9,324,611 B2
(45) Date of Patent: Apr. 26, 2016

(54) CORROSION RESISTANT VIA CONNECTIONS IN SEMICONDUCTOR SUBSTRATES AND METHODS OF MAKING SAME

(75) Inventor: Swarnal Borthakur, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 948 days.

(21) Appl. No.: 12/062,369

(22) Filed: Apr. 3, 2008

(65) Prior Publication Data
US 2009/0250821 A1  Oct. 8, 2009

(51) Int. Cl.
*H01L 21/44* (2006.01)
*H01L 21/768* (2006.01)
*H01L 23/48* (2006.01)

(52) U.S. Cl.
CPC ........ *H01L 21/76898* (2013.01); *H01L 23/481* (2013.01); *H01L 2924/0002* (2013.01)

(58) Field of Classification Search
CPC .................................................... H01L 21/44
See application file for complete search history.

(56) References Cited

U.S. PATENT DOCUMENTS

| 6,479,902 | B1 * | 11/2002 | Lopatin et al. | 257/774 |
|---|---|---|---|---|
| 6,548,909 | B2 | 4/2003 | Brofman et al. | |
| 6,667,551 | B2 * | 12/2003 | Hanaoka et al. | 257/750 |
| 6,927,493 | B2 | 8/2005 | Bojkov et al. | |
| 7,084,509 | B2 | 8/2006 | Egitto et al. | |
| 7,199,036 | B2 | 4/2007 | Chan | |
| 7,215,032 | B2 | 5/2007 | Trezza | |
| 7,262,505 | B2 | 8/2007 | Ahn et al. | |
| 2002/0115290 | A1 * | 8/2002 | Halahan et al. | 438/667 |
| 2005/0151268 | A1 | 7/2005 | Boyd et al. | |
| 2006/0220141 | A1 * | 10/2006 | Besser | 257/371 |
| 2007/0032061 | A1 * | 2/2007 | Farnworth et al. | 438/597 |
| 2007/0045388 | A1 * | 3/2007 | Farnworth et al. | 228/244 |
| 2008/0050911 | A1 * | 2/2008 | Borthakur | 438/622 |
| 2008/0284041 | A1 * | 11/2008 | Jang et al. | 257/774 |

FOREIGN PATENT DOCUMENTS

| EP | 1367644 | 12/2003 |
|---|---|---|
| WO | WO2004/081990 | 9/2004 |

OTHER PUBLICATIONS

Sundaram, Venky; Tummala, Rao R.; Liu, Fuhan; Kohl, Paul A.; Li, Jun; Bidstrup-Allen, Sue Ann; Fukuoka, Yoshitaka; Next-Generation Microvia and Global Wiring Technologies for SOP; vol. 27, Issue 2, May 2004 pp. 315-325.
Liu, Fuhan; Sundaram, Venky; Wiedenman, Boyd; Tummala, Rao; Advances in High Density Interconnect Substrate and Printed Wiring Board Technology; Volume , Issue , Aug. 30-Sep. 2, 2005 pp. 307-313.

* cited by examiner

*Primary Examiner* — Marvin Payen
(74) *Attorney, Agent, or Firm* — Fetcher Yoder, P.C.

(57) ABSTRACT

Devices and methods for protecting the metal within a via in a semiconductor substrate from corrosion are provided. Specifically, embodiments of the present invention relate to disposing a corrosion resistant metal layer within a recess formed in a semiconductor substrate such that the metal subsequently deposited within the via will adhere to the corrosion resistant metal layer, then backgrinding the bottom surface of the semiconductor substrate to expose the corrosion resistant metal. For example, the metal deposited within the recess may be copper, while the corrosion resistant metal may be a noble metal such as palladium.

23 Claims, 4 Drawing Sheets

CORROSION RESISTANT VIA CONNECTIONS IN SEMICONDUCTOR SUBSTRATES AND METHODS OF MAKING SAME

BACKGROUND

1. Field of the Invention

Embodiments of the present invention relate generally to the field of semiconductor devices. More particularly, embodiments of the present invention relate to improved semiconductor devices and improved fabrication techniques for semiconductor devices.

2. Description of the Related Art

As electronics continue toward greater miniaturization and faster processing speeds, various techniques have been developed for more compact packaging and increased transmission speeds in semiconductor chips. For example, because of its higher electrical conductance, copper is replacing aluminum as a material for making electrical connections between semiconductor devices or layers in semiconductor devices. One technique that has become widely adopted is the use of copper filled vias for making an electrical connection between the front and back sides of a chip or layers within a chip. Typically, the exposed copper protruding from the bottom of the chip is then soldered to a circuit board or another chip. This technique facilitates the stacking of chips and also shortens the interconnection between chip and other circuitry, compared to wire bonding techniques in which metal lines run along the top surface of the chip. Shortening the length of these electrical connections reduces RC delay and wire inductance, thereby increasing the signal transmission speed.

One of the challenges of forming a high quality copper via is that copper oxidizes very readily. If an oxide layer forms on the exposed surface of the copper, the oxide layer will interfere with the physical and electrical bonding of the copper to other metals and minimize the electrical conductance of the copper via. To ensure a good electrical connection, a plating process, such as Under Bump Metallization (UBM) process, is typically used to prevent the exposed copper from oxidizing. The metallization process adds additional cost to the fabrication of the chip and also presents an area of possible chip failure. For example, it has been found that tin plating over copper is susceptible to cracking. Additionally, the metallization process provides no corrosion protection for the copper sidewall within the via.

Therefore, it may be advantageous to provide an improved device and process for preventing corrosion of the metal within a metal-filled conductive via.

DETAILED DESCRIPTION

Embodiments of the present invention generally relate to methods for protecting the metal within a conductive via from corrosion. Some embodiments of the present invention are directed to semiconductor devices that have been formed or partially formed in accordance with these methods. Specifically, embodiments of the present invention relate to disposing a corrosion resistant material layer within a recess formed in a semiconductor substrate such that the metal subsequently deposited within the via will adhere to the corrosion resistant material layer, and then backgrinding the bottom surface of the semiconductor substrate to expose the corrosion resistant material stud. For example, the metal deposited within the recess may be copper, while the corrosion resistant material may be a noble metal such as palladium, gold, or platinum. Alternatively, the corrosion resistant material may be a metal compound, such as titanium diboride or magnesium diboride, or the corrosion resistant material may be a metal alloy, such as palladium gold, palladium nickel or gold nickel. A conductive via structured according to embodiments of the present invention will first be described with reference to FIG. 2. Methods of forming the structure of FIG. 1. will then be described with reference to FIGS. 2-8.

Figure 1:
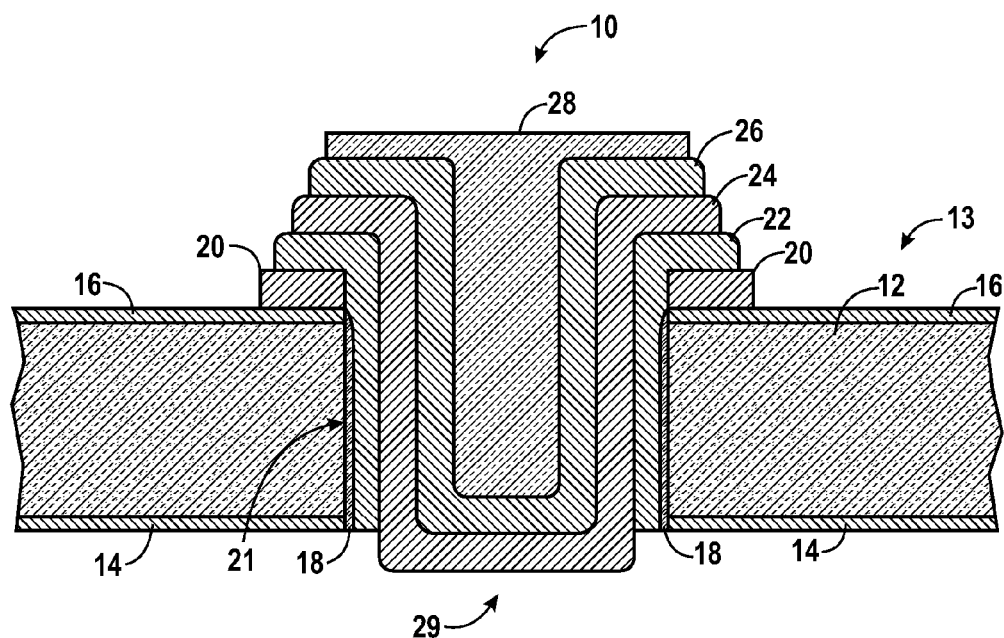
FIG. 1 is a cross-sectional view of an embodiment of a conductive via formed in a semiconductor device with a protective metal layer in accordance with embodiments of the present invention.

FIG. 1 depicts a final structure of a conductive via 10 formed in a semiconductor device 13 with a protective metal layer 24 in accordance with the method of fabrication detailed below. It should be appreciated that the illustrations provided are not drawn to scale. The semiconductor device 13 can be any kind of semiconductor device including, for example, a DRAM chip, a photodiode array or an integrated circuit. In the illustrated embodiment, the semiconductor device 13 includes a semiconductor substrate 12, such as silicon. Alternatively, embodiments of the present invention may be implemented using any form of semiconductor substrate, such as germanium, gallium arsenide, or silicon carbide, for example.

The semiconductor device 13 further includes a passivation layer 14 and an oxide layer 16, which protect the bottom surface and top surface of the semiconductor device 13, respectively. For example, the passivation layer 14 and oxide layer 16 may be any suitable material, such as silicon nitride, silicon dioxide or a borophosphosilicate glass (BPSG). For another example, the passivation layer 14 may be a photodefinable resist material (e.g., organic/polymeric compounds) that can be fully cured. Both the passivation layer 14 and oxide layer 16 protect the surface of the semiconductor device from physical damage as well as electrical and chemical contamination. The oxide layer 16 may additionally serve to insulate the top surface of the semiconductor substrate 12 from metal interconnects.

The semiconductor device 13 also includes a metal pad 20 disposed on the top surface of the semiconductor substrate 12. The metal pad 20 serves to electrically couple the conductive via 10 with other circuits within the semiconductor device 13. The metal pad 20 may, for example, be electrically coupled to metal traces (not shown) that run over the top surface of the oxide layer 16.

The semiconductor device 13 also includes a through via 21 formed through the metal pad 20 and extending through the semiconductor substrate 12 to the bottom surface of the semiconductor device 13. In the embodiment shown in FIG. 1, the through via 21 may be approximately 150 microns wide by 50 microns deep. Alternatively, embodiments of the present invention may employ a wide range of dimensions. For example, embodiments of the present invention may include a through via 21 with the dimensions of 100 microns deep by 40 microns wide. Additionally, aspect ratios of the through via 21 may range from less than 2 to 1 to more than 5 to 1. As used herein, the "through via 21" refers to the opening formed through the semiconductor substrate 12. References to the "conductive via 10" connote the through via 21 after the through via 21 is completely filled with one or more conductive materials.

Within the through via 21 is included an electrically insulative layer 18 that prevents the conductive via 10, from shorting to the semiconductor substrate 12. The electrically insulative layer 18 may be any dielectric material commonly used for electrical insulation in semiconductor devices, such as a silicon dioxide layer, for example.

Also within the through via 21 are several layers of conductive material, including a barrier layer 22, a protective layer 24, a seed layer 26, and a metal layer 28. These conductive layers form an electrical connection between the metal pad 20 on the top surface of the semiconductor device 13 and an exposed portion on the bottom surface of the semiconductor device 13. The metal protruding from the bottom surface can then be electrically coupled to a semiconductor package, a circuit board or another chip, as will be appreciated by those of ordinary skill in the art. Additionally, although not depicted, a conductive seed layer, such as a copper seed layer, may also be included over the barrier layer 22 to facilitate the adhesion of the protective layer 24. In other embodiments, the barrier layer 22 may be comprised of a low resistivity material that allows the protective layer 24 to be deposited by electrochemical plating, in which case, a seed layer may not be included over the barrier layer 22.

The barrier layer 22 prevents migration of metal ions into the semiconductor substrate 12. The barrier layer 22 may include any material known in the art for preventing migration of metal ions. For example, if the metal layer 28 is copper, the barrier layer may include materials such as tantalum (Ta), tantalum nitride (TaN), titanium (Ti), or titanium tungsten (TiW), for example.

In accordance with embodiments of the invention, the protective layer 24 (or corrosion resistant layer 24) surrounds the seed layer 26 and the metal layer 28 and prevents oxidization of the metal at the conductive protrusion 29, as well as at the sidewalls within the conductive via 10. In one embodiment, the protective layer 24 is palladium. In another embodiment, other noble metals such as gold, or platinum, for example, may also be used in place of, or in combination with palladium. In another embodiment, the protective layer 24 may also be composed of less corrosion resistant metals, such as nickel. If less corrosion resistant metals are utilized an additional step of metallization of the protective layer 24, such as gold immersion, for example, may also be employed. Alternatively, the protective layer 24 may be a metal compound, such as titanium diboride or magnesium diboride, or the metal may be a metal alloy, such as palladium gold, palladium nickel or gold nickel.

In embodiments of the present invention, once formed, the conductive protrusion 29 may be electrically and physically coupled to a semiconductor package, to a circuit board, or to another semiconductor chip such as another semiconductor device made in accordance with embodiments of the present invention. This process will typically involve cutting the semiconductor wafer into several die after formation of the metallized vias, and soldering the conductive protrusion or protrusions into place. Embodiments of the present invention also include electrically coupling the conductive via 10 to another semiconductor device, in which case metallization of the top surface of the conductive via 10 may also be employed. This metallization process may include any techniques known in the art for disposing corrosion resistant metal plating, such as electroless plating, and ECD, for example.

The conductive via 10 is fabricated by a process wherein the metal layer 28 is not exposed at the bottom of the semiconductor device 13 when the conductive via 10 is prepared for coupling to another device. Thus, the metal layer 28 is not exposed to oxidization. Additional metallization of the exposed conductive protrusion is, therefore, not required. The structures resulting from this process include superior metal vias that are protected both at the conductive protrusion 29 and the inside sidewalls of the conductive via 10 and are less susceptible to separation of the protective material from the metal layer 28. This process also eliminates the added steps associated with an additional metal plating process such as UBM, resulting in production cost savings.

FIGS. 2-8 illustrate fabrication steps in accordance with embodiments of the present invention. Because a wide variety of alternate techniques are available in the field of semiconductor fabrication, it will be appreciated by those of ordinary skill in the art that many deviations from the following process may be made while still falling within the scope of the present invention.

Figure 2:
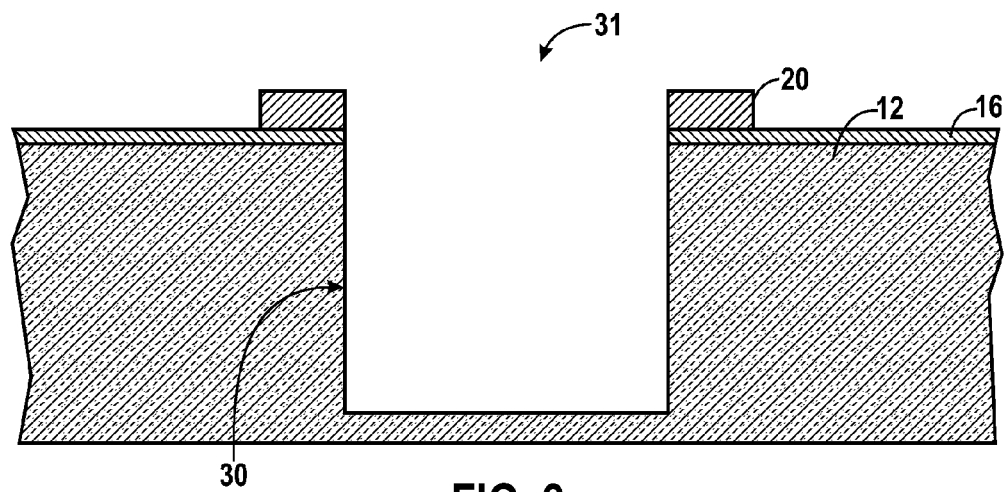
FIGS. 2-8 are cross-sectional views of a semiconductor device that illustrate the process steps used in fabricating the device in accordance with embodiments of the present invention.

FIG. 2 illustrates the initial process steps in accordance with an embodiment of the present invention. In particular, FIG. 2 depicts a structure 31, in which a recess 30 has been formed in the semiconductor substrate 12 of a semiconductor device 13. The semiconductor device 13 may have electrical components, such as transistors or memory devices, already formed prior to formation of the recess 30; however, embodiments of the present invention may be employed in a via-first application. A typical process for achieving the arrangement shown in FIG. 2 includes forming a layer of low-dielectric-constant material, such as silicon dioxide or silicon oxycarbide on the top surface of the semiconductor substrate 12 to form an oxide layer 16. Next, a layer of aluminum may be deposited over the semiconductor substrate 12 and patterned to form the metal pad 20. Those of ordinary skill in the art will recognize various methods of depositing the metal pad 20. It will be understood, for example, that the formation of the metal pad 20 involves the use of photolithography techniques, wherein a coating of photoresist is deposited over the top surface of the semiconductor substrate 12 and exposed to a pattern of light that defines the desired structures. The metal deposition may be achieved by any known method, such as electrochemical deposition (ECD), physical vapor deposition (PVD) and sputter deposition, for example.

In one process, after patterning the metal pad 20, a recess 30 may be formed by etching a portion of the metal pad 20 and subsequently etching the oxide layer 16 to expose the semiconductor substrate 12 underneath. Alternatively, embodiments of the present invention may include first forming a recess 30 and subsequently forming a metal pad 20 around the recess 30. As discussed above, formation of the recess 30 may involve photolithography techniques known to those skilled in the art. Additionally, formation of the recess 30 may be realized by any technique or combination of techniques known in the art, including wet or dry etching techniques, for example. In one embodiment, the recess 30 is formed by a deep reactive-ion etch process, such as the Bosch etch process, to achieve near vertical side walls in high aspect ratio embodiments of the present invention.

Figure 3:
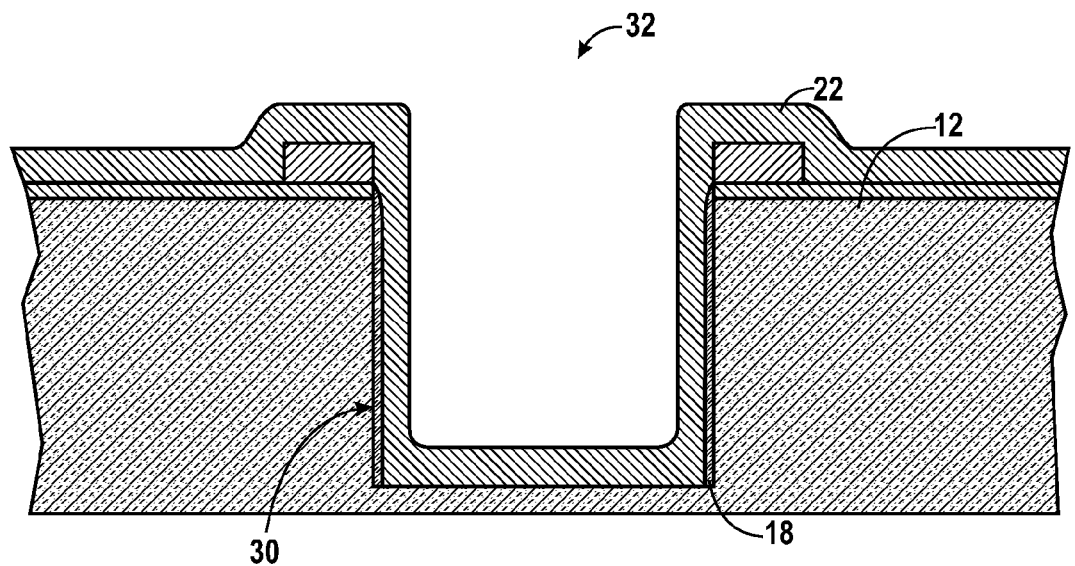

FIG. 3 illustrates the next set of process steps performed on the completed structure 31 of FIG. 2 in accordance with an embodiment of the present invention. In particular, FIG. 3 depicts a structure 32 in which an insulative layer 18 and a barrier layer 22 have been deposited. The insulative layer 18 may be deposited by pulse deposition into the recess 30, and a spacer etch process may be used to remove the insulative material from the top and bottom surface of the recess 30, leaving the insulative layer 18 on the sidewalls only. Next, the barrier layer 22 is deposited inside the recess 30 by a PVD process in the range of a few hundred angstroms thick (for example 250 angstroms thick). The barrier layer 22 may include any barrier material known in the art. For example, if the metal layer 28 (FIG. 1) to be used is copper, the barrier layer 22 may include materials such as tantalum (Ta), titanium (Ti), or titanium tungsten (TiW), for example. The barrier layer 22 may also include a seed layer (not depicted), such as a copper seed layer, deposited by PVD in the submicron thickness range (for example 0.2 microns thick). The seed component of the barrier layer facilitates the adhesion of the next layer.

Figure 4:
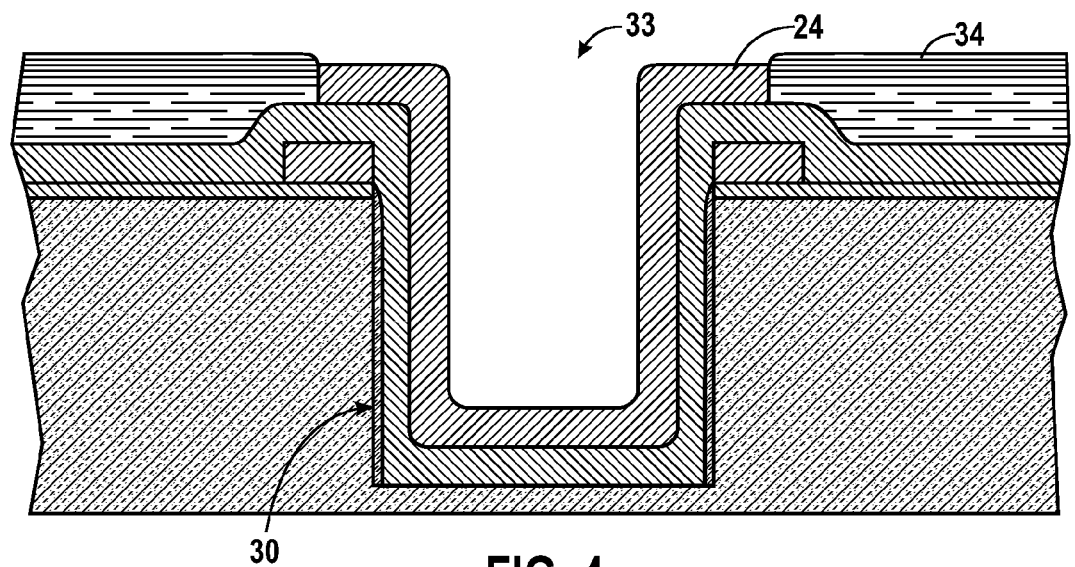

FIG. 4 illustrates the next set of process steps performed on the completed structure 32 of FIG. 3 in accordance with an embodiment of the present invention. In particular, FIG. 4 depicts a structure 33, in which the protective layer 24 has been deposited within the recess 30. According to one embodiment, the structure 33 may be obtained by first depositing a photoresist layer 34 over the entire wafer and processing the photoresist to expose the recess 30. Next, the protective layer 24 may be deposited inside the recess 30 by ECD. In embodiments of the present invention, electroless plating may also be used to deposit the protective layer 24; however, in high aspect ratio applications, ECD will generally yield more uniform layer depositions. If the metal layer 28 to be later deposited includes copper, the protective layer 24 may include palladium due to palladium's compatibility with ECD and its good adhesion properties to both copper and solder. In other embodiments, the protective layer 24 may include other ECD compatible noble metals, such as gold or nickel, for example.

Figure 5:
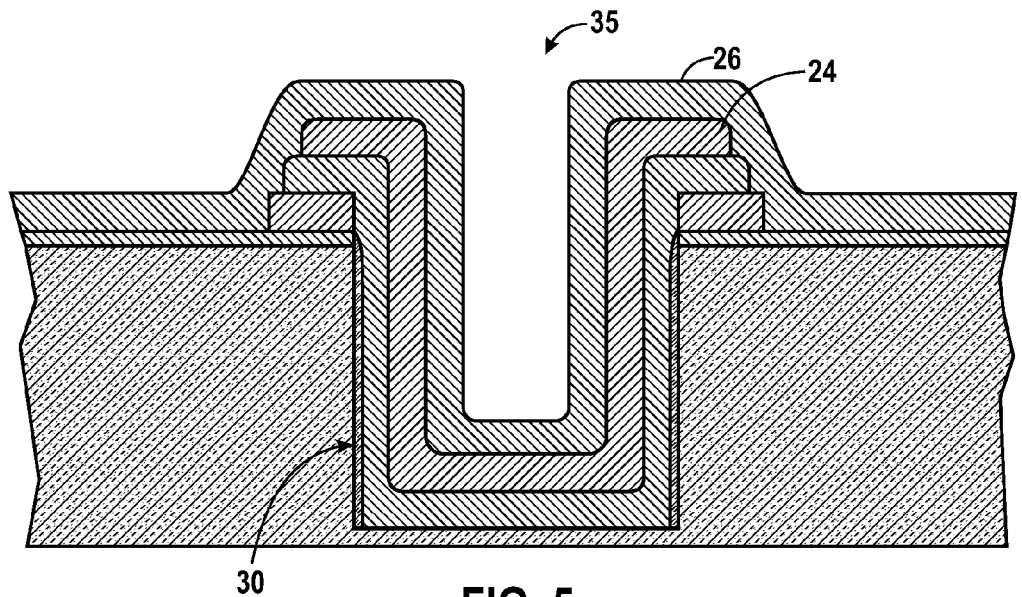

FIG. 5 illustrates the next set of process steps performed on the completed structure 33 of FIG. 4 in accordance with an embodiment of the present invention. In particular, FIG. 5 depicts a structure 35 in which the seed layer 26 has been deposited over the protective layer 24. According to one embodiment, the structure 35 may be obtained by first removing the photoresist layer 34 and then etching the exposed barrier layer to remove the unneeded barrier and seed material. Next, the seed layer 26 is deposited over the entire wafer, including inside the recess 30, by a PVD process. The seed layer 26 facilitates the adhesion and growth of the metal layer 28 to be deposited in the next set of process steps illustrated in FIG. 6. For example, if the metal layer 28 to be later disposed is copper, the seed layer 26 may also be copper. It should be noted that in embodiments of the present invention, the step of etching the excess barrier layer may be eliminated, in which case, the seed layer 26 would be deposited over the protective layer 24 as well as the excess barrier layer material. In yet other embodiments, the step of depositing a seed layer 26 may also be eliminated, in which case, the metal layer is ECD deposited directly over the protective layer 24.

Figure 6:
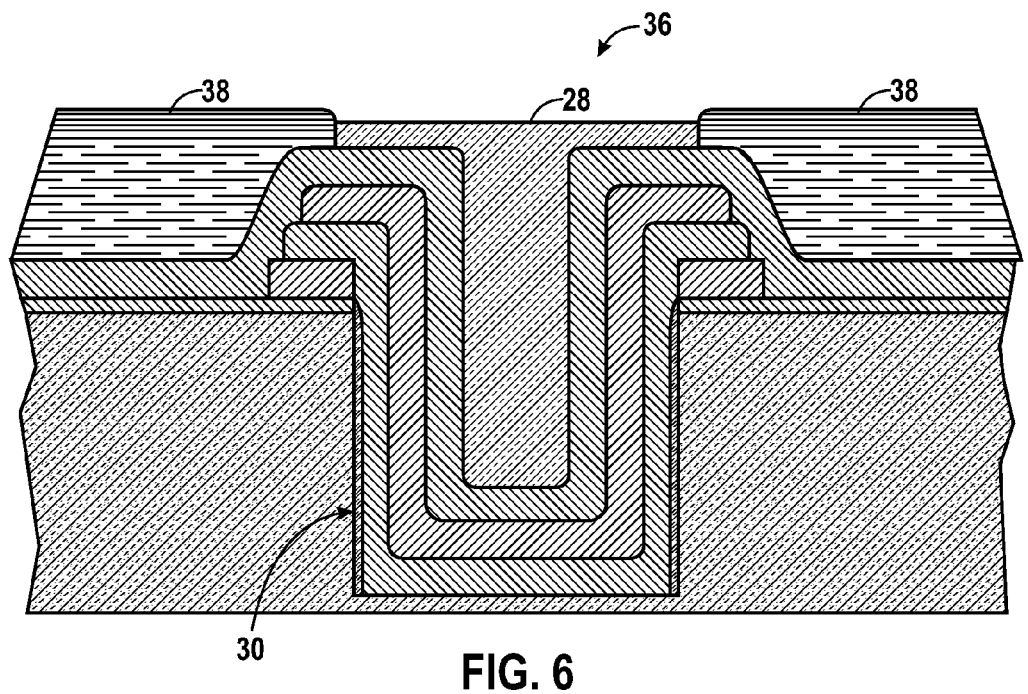

FIG. 6 illustrates the next set of process steps performed on the completed structure 35 of FIG. 5 in an embodiment of the present invention. In particular, FIG. 6 depicts a structure 36, in which the metal layer 28 has been deposited within the recess 30. According to one embodiment, the structure 36 may be obtained by depositing a photoresist layer 38 over the entire wafer and processing the photoresist to expose the recess 30. Next, the recess 30 is filled by ECD with a metal, such as copper, to create the metal layer 28. Although the metal layer 28 is depicted as completely filling the recess 30, embodiments of the present invention may include a metal layer that only covers the inside walls of the recess 30 to a specified thickness.

Figure 7:
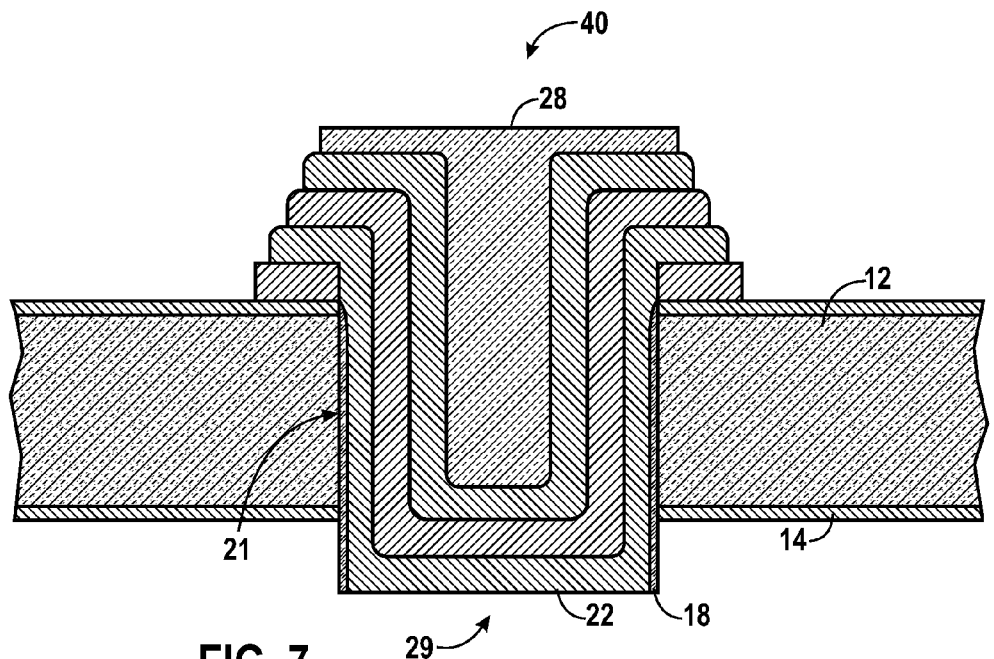

FIG. 7 illustrates the next set of process steps in an embodiment of the present invention. In particular, FIG. 7 depicts a structure 40, in which a bottom layer of the semiconductor substrate 12 has been removed. According to one embodiment, the structure 40 may be obtained by removing the photoresist layer 38, and etching the exposed seed layer to remove the excess material. The processing of the top surface of the structure 40 may come before or after the processing of the bottom surface of the structure 40. The bottom surface of the structure 40 is processed to remove a portion of the semiconductor substrate 12 surrounding the conductive via 10 and thereby expose the conductive protrusion 29. In one embodiment of the present invention, a portion of the semiconductor substrate 12 may be removed using any backgrinding technique known to those of ordinary skill in the art. For example, the backgrinding may include a chemical-mechanical planarization process involving a series of coarse and/or fine grinds aided by chemical slurry. In a typical example, chemical-mechanical planarization may be employed to expose the bottom surface of the barrier layer 22, transforming recess 30 into through via 21. That is, the through via 21 is the recess 30, once the opening extends through the entire semiconductor substrate 12. The planarization is then followed by a wet etch process to remove a desired thickness of the semiconductor substrate material around the conductive via 10. The wet etch process may be a chemical etch that is selective to the semiconductor substrate 12 and, therefore, does not substantially disturb the insulative layer 18 or the barrier layer 22. In an alternative embodiment, the chemical-mechanical planarization step may be eliminated, in which case the removal of excess semiconductor material may be fully accomplished through wet or dry chemical etching.

After exposing the conductive protrusion 29, the bottom surface of the semiconductor device 13 is passivated. As described above, the passivation layer 14 may, for example, include silicon nitride, silicon dioxide or a borophosphosilicate glass (BPSG) and may be created by any passivation process known in the art. Additionally, the passivation layer 14 may be a fully cured organic polymer such as a fully cured photoresist material.

Figure 8:
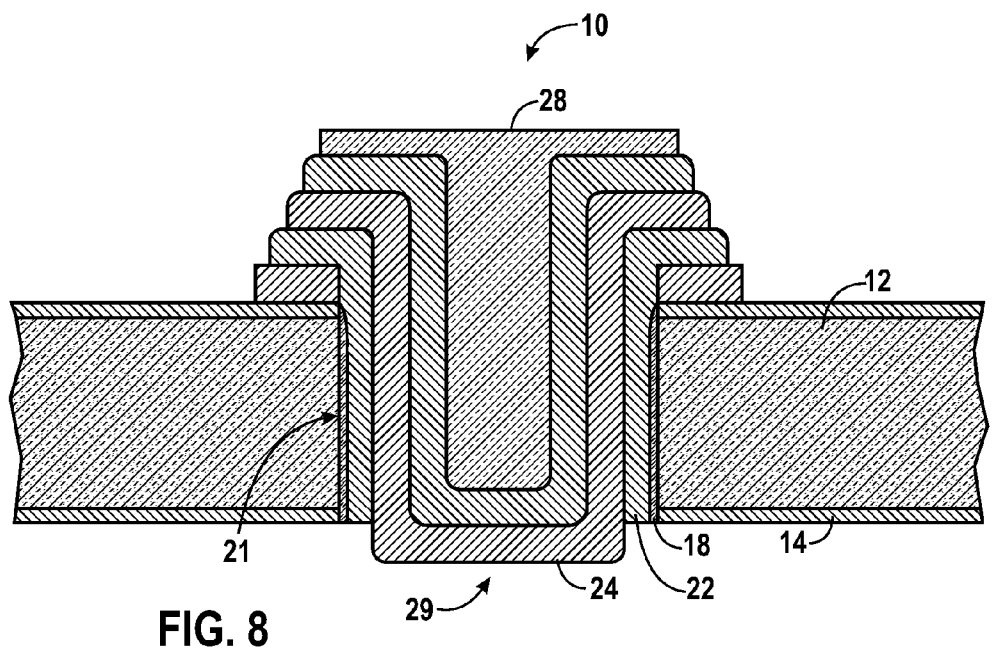

FIG. 8 illustrates the final process steps performed on the completed structure 40 of FIG. 7 in accordance with an embodiment of the present invention. In particular, FIG. 8 depicts a conductive via 10 in accordance with an embodiment of the present invention. The conductive via 10 may be obtained by removing the bottom surface of the insulative layer 18 and the barrier layer 22 to expose the protective layer 24. Specifically, portions of the insulative layer 18 and the barrier layer 22 are removed by exposing the bottom surface of the semiconductor substrate 12 to a chemical etchant that is selective to the insulative layer 18 and the barrier layer 22. After etching the insulative layer 18 and the barrier layer 22, the conductive protrusion 29 is exposed, creating the conductive via depicted in both FIGS. 1 and 8.

Those of ordinary skill in the art will recognize the advantages of forming a conductive via in accordance with the processes describe above. For example, it will be appreciated that the metal layer 28 is surrounded by a corrosion resistant layer 24 from the moment it is deposited, thereby protecting the metal from oxidization and eliminating the need for an additional step of metallization such as UBM. Additionally, unlike the usual metallization techniques, the protective layer 24 surrounds the metal layer 28 within the sidewalls of through via 21, thereby protecting the sidewalls of the metal layer 28. Additionally, the protective layer 24 is less susceptible to separation from the metal layer 28 compared to the other metallization techniques.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a conductive via in a semiconductor substrate, comprising:
   forming a recess in a top surface of the semiconductor substrate;
   depositing a layer of corrosion resistant material on an inside surface of the recess, such that the layer of corrosion resistant material is disposed along sidewalls and along a bottom surface of the recess;
   depositing a layer of metal inside the recess over the layer of corrosion resistant material; and
   etching a bottom surface of the semiconductor substrate so that at least the layer of corrosion resistant material disposed along the bottom surface of the recess is exposed through a bottom surface of the semiconductor substrate.

2. The method of claim 1, comprising:
   forming a barrier layer in the recess, wherein the barrier layer is configured to substantially prevent ion migration between the layer of metal and the semiconductor substrate; and
   removing a bottom layer of the semiconductor substrate to expose a bottom surface of the barrier layer.

3. The method of claim 1, comprising forming a seed layer over the layer of corrosion resistant material, wherein the seed layer is configured to aid the adhesion of the layer of metal to the layer of corrosion resistant material.

4. The method of claim 2, wherein forming the barrier layer includes forming a seed layer configured to aid the adhesion of the layer of corrosion resistant material to the barrier layer.

5. The method of claim 1, wherein forming a recess in the semiconductor substrate comprises of a Bosch etch process.

6. The method of claim 1, wherein depositing a layer of corrosion resistant material on an inside surface of the recess comprises depositing a metal, a metal compound or a metal alloy.

7. The method of claim 1, wherein depositing a layer of corrosion resistant material on an inside surface of the recess comprises depositing palladium, gold, platinum or nickel.

8. The method of claim 1, wherein depositing a layer of corrosion resistant material on an inside surface of the recess comprises depositing palladium gold, palladium nickel, gold nickel, titanium diboride or magnesium diboride.

9. The method of claim 1, wherein depositing a layer of metal inside the recess over the layer of corrosion resistant material comprises depositing copper.

10. A method of fabricating a semiconductor device with at least one conductive via, comprising the steps of:
    forming at least one integrated circuit device on a semiconductor substrate;
    forming at least one recess in the semiconductor substrate;
    depositing a layer of corrosion resistant metal inside the at least one recess, such that the layer of corrosion resistant metal is disposed over at least a bottom surface of the at least one recess;
    depositing a layer of metal inside the at least one recess, over the layer of corrosion resistant metal;
    etching a bottom surface of the semiconductor substrate so that at least the layer of corrosion resistant metal disposed over the bottom surface of the at least one recess is accessible through the bottom surface of the semiconductor substrate; and
    forming at least one conductive trace to electrically couple the at least one circuit device to the at least one conductive via.

11. The method of claim 10, wherein removing a portion of the bottom surface of the semiconductor substrate comprises etching the bottom surface of the semiconductor substrate to a depth sufficient to allow at least the layer of corrosion resistant metal to protrude through the bottom surface of the semiconductor substrate.

12. The method of claim 10, wherein depositing the layer of metal comprises depositing the layer of metal such that it extends above a top surface of the semiconductor substrate.

13. The method of claim 10, further comprising forming a protective layer over a top surface of the conductive via, configured to prevent corrosion of the top surface of the conductive via.

14. A method of forming a conductive via in a semiconductor substrate, comprising:
    forming a conductive pad on the top surface of a semiconductor substrate;
    forming an opening through the conductive pad;
    forming a recess in the semiconductor substrate through the opening below the conductive pad;
    forming an electrically insulative layer on an inside surface of the recess, configured to prevent the flow of electrical current to the conductive substrate;
    forming a barrier layer over the electrically insulative layer, configured to prevent ion migration through the barrier layer to the semiconductor substrate;
    forming a layer of corrosion resistant metal over the barrier layer, such that at least a portion of the layer of corrosion resistant metal is planar to a bottom layer of the semiconductor substrate;
    forming a layer of metal within the recess over the layer of corrosion resistant metal; and
    etching the bottom layer of the semiconductor substrate so that at least the layer of corrosion resistant metal planar to the bottom layer of the semiconductor substrate is exposed through the bottom layer of the semiconductor substrate.

15. The method of claim 14, wherein forming the layer of corrosion resistant metal comprises forming a layer of palladium, gold, platinum, copper or nickel.

16. The method of claim 14, wherein etching the bottom surface of the semiconductor substrate comprises etching to a depth sufficient to allow at least the layer of corrosion resistant metal to protrude through the bottom surface of the semiconductor substrate.

17. The method of claim 14, further comprising forming a protective layer over a top surface of the at least one conductive via, configured to prevent corrosion of the top surface of the conductive via.

18. The method of claim 1, further comprising backgrinding a bottom surface of the semiconductor substrate.

19. The method of claim 1, wherein etching the bottom surface of the semiconductor substrate exposes at least the layer of corrosion resistant material as a conductive protrusion.

20. The method of claim 10, further comprising backgrinding a bottom surface of the semiconductor substrate.

21. The method of claim 10, wherein etching the bottom surface of the semiconductor substrate makes at least the layer of corrosion resistant material accessible as a conductive protrusion.

22. The method of claim 14, further comprising backgrinding the bottom surface of the semiconductor substrate.

23. The method of claim 14, wherein etching the bottom layer of the semiconductor substrate exposes at least the layer of corrosion resistant material as conductive protrusion.

\* \* \* \* \*